(12) United States Patent
Hashiguchi et al.

(10) Patent No.: US 9,257,593 B2
(45) Date of Patent: Feb. 9, 2016

(54) METHOD FOR PRODUCING PHOTOELECTRIC CONVERSION ELEMENT

(71) Applicant: SANYO Electric Co., Ltd., Osaka (JP)

(72) Inventors: Taiki Hashiguchi, Kaizuka (JP); Yutaka Kirihata, Kaizuka (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 0 days.

(21) Appl. No.: 14/029,367

(22) Filed: Sep. 17, 2013

(65) Prior Publication Data

US 2014/0017850 A1    Jan. 16, 2014

Related U.S. Application Data

(63) Continuation of application No. PCT/JP2012/057006, filed on Mar. 19, 2012.

(30) Foreign Application Priority Data

Mar. 25, 2011   (JP) ................................ 2011-067625

(51) Int. Cl.
*H01L 21/00* (2006.01)
*H01L 31/20* (2006.01)
*H01L 31/0216* (2014.01)
*H01L 31/0224* (2006.01)
*H01L 31/0352* (2006.01)
*H01L 31/068* (2012.01)
*H01L 31/0747* (2012.01)

(52) U.S. Cl.
CPC .......... *H01L 31/20* (2013.01); *H01L 31/02167* (2013.01); *H01L 31/022441* (2013.01); *H01L 31/03529* (2013.01); *H01L 31/0682* (2013.01); *H01L 31/0747* (2013.01); *H01L 31/202* (2013.01); *Y02E 10/547* (2013.01)

(58) Field of Classification Search
None
See application file for complete search history.

(56) References Cited

U.S. PATENT DOCUMENTS 9,070,822 B2 *   6/2015   Kirihata et al.
2007/0169808 A1 *   7/2007   Kherani et al. ............... 136/258

(Continued)

FOREIGN PATENT DOCUMENTS

EP    2293351 A2    3/2011
JP    06013639 A    1/1994

(Continued)

OTHER PUBLICATIONS

Extended European Search Report regarding 12763547.2-1508/2690666, PCT/JP2012057006: Date of Mailing: Aug. 6, 2014; 8 Pages.

*Primary Examiner* — Reema Patel
(74) *Attorney, Agent, or Firm* — Cantor Colburn LLP

(57) ABSTRACT

There is provided a method of producing a photovoltaic element comprising: a first step in which an i-type amorphous silicon layer (16) and an n-type amorphous silicon layer (14) are formed over a light-receiving surface of an n-type monocrystalline silicon substrate (18); a second step in which an i-type amorphous silicon layer (22a) and an n-type amorphous silicon layer (23a) are formed over a back surface of the n-type monocrystalline silicon substrate (18); and a third step in which, after the first step and the second step are completed, protection layers are formed over the n-type amorphous silicon layer (14) and the n-type amorphous silicon layer (23a).

4 Claims, 7 Drawing Sheets

(56) References Cited

U.S. PATENT DOCUMENTS

| | | |
|---|---|---|
| 2010/0059099 A1 | 3/2010 | Arai |
| 2010/0084009 A1 | 4/2010 | Carlson et al. |
| 2010/0263722 A1 | 10/2010 | Kubo et al. |
| 2010/0330730 A1 | 12/2010 | Hong et al. |
| 2012/0247539 A1* | 10/2012 | Cabarrocas .................. 136/249 |
| 2014/0024167 A1* | 1/2014 | Kirihata et al. ................ 438/87 |

FOREIGN PATENT DOCUMENTS

| | | | |
|---|---|---|---|
| JP | 2009200267 A | 9/2009 | |
| JP | 2009533864 A | 9/2009 | |
| JP | 2010087495 A | 4/2010 | |
| JP | 2011035092 A | 2/2011 | |
| WO | 03/083955 A1 | 10/2003 | |
| WO | WO 2010151478 A1 * | 12/2010 | ............ H01L 31/102 |
| WO | WO 2011073868 A3 * | 9/2011 | .......... H01L 31/0224 |

* cited by examiner

METHOD FOR PRODUCING PHOTOELECTRIC CONVERSION ELEMENT

CROSS-REFERENCE TO RELATED APPLICATION

The present application is a continuation under 35 U.S.C. §120 of PCT/JP2012/057006, filed on. Mar. 19, 2012, which is incorporated herein by reference and which claimed priority to Japanese Patent Application No. 2011-067625 filed on Mar. 25, 2011. The present application likewise claims priority under 35 U.S.C. §119 to Japanese Patent Application No. 2011-067625 filed on Mar. 25, 2011, the entire content of which is also incorporated herein by reference.

TECHNICAL FIELD

The present invention relates to a method of producing a photovoltaic element.

BACKGROUND ART

Various photovoltaic elements which use monocrystalline silicon, polycrystalline silicon, or amorphous silicon are being developed. As an example, Patent Document 1 discloses a photovoltaic element comprising a semiconductor substrate comprising monocrystalline silicon and having a light-receiving surface and a back surface provided on a side opposite the light-receiving surface; a first semiconductor layer and a second semiconductor layer comprising amorphous silicon, formed along a predetermined direction over the back surface, and in which layers of different conductive types are alternately placed along the back surface; an insulating layer formed straddling from a region over the second semiconductor layer to a region over the first semiconductor layer; a transparent electrode layer covering the first semiconductor layer and the second semiconductor layer; and a collective electrode layer formed over the transparent electrode layer.

RELATED ART REFERENCES

Patent Document

[Patent Document 1] JP 2009-200267 A

DISCLOSURE OF INVENTION

Technical Problem

In a photovoltaic element in which carriers are generated in the semiconductor substrate, characteristics of an interface between a semiconductor substrate comprising monocrystalline silicon and a semiconductor layer comprising amorphous silicon significantly affect the power generation efficiency. In addition, a contact resistance or the like in the electricity-collecting electrode in which carriers are extracted from the semiconductor substrate also significantly affects the power generation efficiency.

Solution to Problem

According to one aspect of the present invention, there is provided a method of producing a photovoltaic element, comprising a first step in which a first amorphous semiconductor-based layer is formed over a light-receiving surface of a crystalline semiconductor-based substrate, a second step in which a second amorphous semiconductor-based layer is formed over a back surface of the crystalline semiconductor-based substrate, and a third step in which, after the first step and the second step are completed, protection layers are formed over the first amorphous semiconductor-based layer and the second amorphous semiconductor-based layer.

Advantageous Effects of Invention

According to various aspects of the present invention, a power generation characteristic of a photovoltaic element can be improved.

BEST MODE FOR CARRYING OUT THE INVENTION

Figure 1:
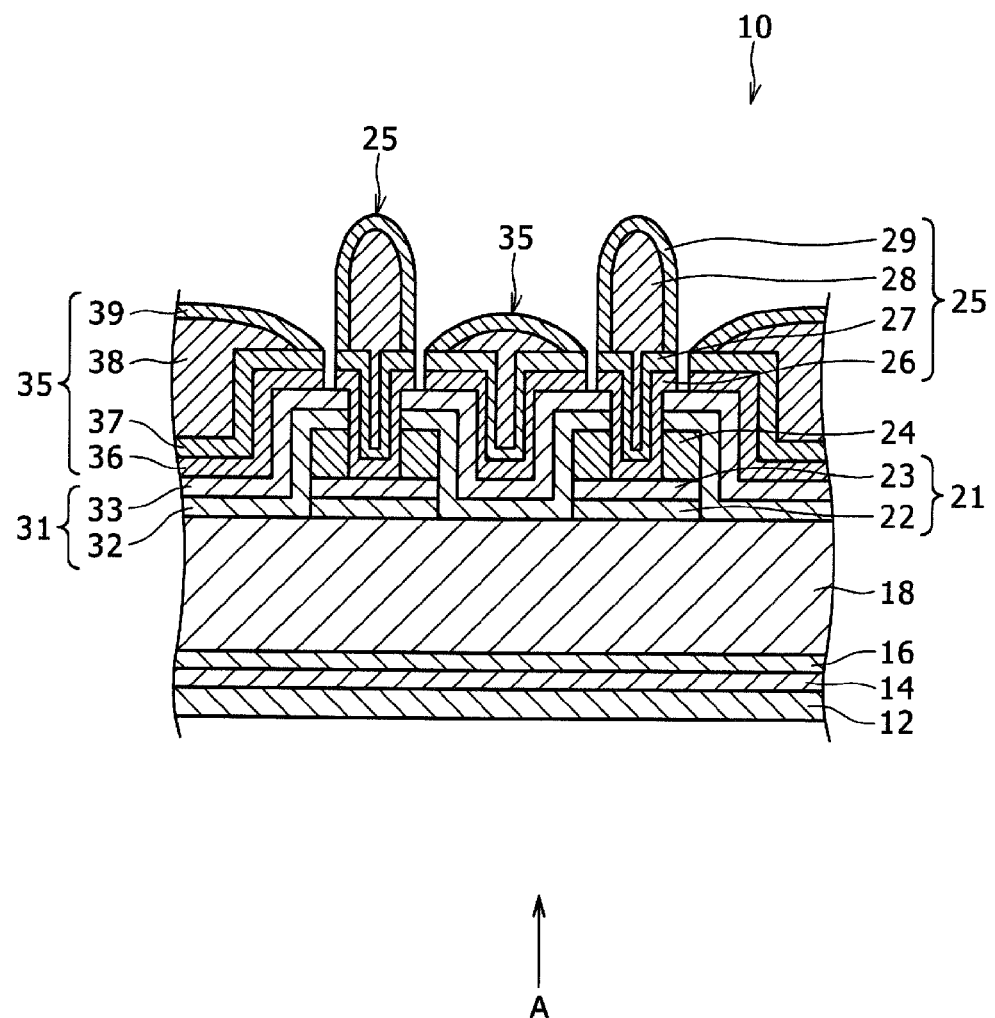
FIG. 1 is a cross sectional diagram of a photovoltaic element according to a preferred embodiment of the present invention.

A preferred embodiment of the present invention will now be described in detail with reference to the drawings. In the following description, the same reference numerals are assigned to similar elements over all drawings, and the descriptions thereof will not be repeated. In addition, in the description in this text, reference numerals that have already been mentioned will be used as necessary.

FIG. 1 is a cross sectional diagram of a photovoltaic element 10. The photovoltaic element 10 comprises a reflection prevention layer 12, an n-type amorphous silicon layer 14, an i-type amorphous silicon layer 16, an n-type monocrystalline silicon substrate 18, an i-n layered section 21, an i-p layered section 31, an insulating layer 24, an n-side electrode section 25, and a p-side electrode section 35. Here, an arrow A shown in FIG. 1 indicates a direction of incidence of light such as solar light to the photovoltaic element 10. A "light-receiving surface" refers to a surface in which the light such as solar light is primarily incident. A "back surface" refers to a surface on a side opposite the light-receiving surface.

The n-type monocrystalline silicon substrate 18 is a power generation layer which receives the incident light from the light-receiving surface and generates carriers. In the present embodiment, the n-type monocrystalline silicon substrate 18 is employed, but the present invention is not limited to such a configuration, and, alternatively, a crystalline semiconductor-based substrate of an n-conductive type or a p-conductive type may be employed. In addition to the monocrystalline silicon substrate, for example, a polycrystalline silicon substrate, a gallium arsenide substrate (GaAs), an indium phosphide substrate (InP), or the like may be employed.

The i-type amorphous silicon layer 16 and the n-type amorphous silicon layer 14 are passivation layers formed over the light-receiving surface of the n-type monocrystalline silicon substrate 18. The i-type amorphous silicon layer 16 and the n-type amorphous silicon layer 14 form an amorphous semiconductor-based layer formed over the light-receiving surface. The i-type amorphous silicon layer 16 is a layer comprising an intrinsic amorphous semiconductor film. The n-type amorphous silicon layer 14 is a layer comprising an amorphous semiconductor film including a dopant of an n-conductive type. For example, the n-type amorphous silicon layer 14 preferably has an n-type dopant concentration greater than or equal to $1 \times 10^{21}/cm^3$.

The amorphous silicon layer in the present embodiment includes a microcrystalline semiconductor film. The microcrystalline semiconductor film is a film in which crystal grains are precipitated in the amorphous semiconductor. An average grain size of the crystal grains is, although not limited to the following, estimated to be greater than or equal to 1 nm and less than or equal to 80 nm.

The reflection prevention layer 12 is formed over the n-type amorphous silicon layer 14, and reduces reflection of light incident from the light-receiving surface of the photovoltaic element 10. The reflection prevention layer 12 also functions as a protection layer which protects a surface of the n-type amorphous silicon layer 14. The reflection prevention layer 12 is preferably formed from a transparent material, and is preferably made from a material and to a thickness with an index of refraction such that, in relation to the index of refraction of the layer covered by the reflection prevention layer 12, reflection of light incident from the light-receiving surface of the photovoltaic element 10 is reduced. The reflection prevention layer 12 is formed of, for example, aluminum oxide, aluminum nitride, silicon nitride, silicon oxide, or the like.

The i-n layered section 21 is formed over the back surface of the n-type monocrystalline silicon substrate 18, and comprises an i-type amorphous silicon layer 22 and an n-type amorphous silicon layer 23. The i-n layered section 21 is preferably placed such that a larger amount of current can be collected in the n-side electrode section 25 to be described later from within the surface of the photovoltaic element 10. The i-n layered section 21 is preferably formed, for example, in a comb-like shape in which a plurality of finger sections extend in parallel with each other.

The i-type amorphous silicon layer 22 is a passivation layer formed over the back surface of the n-type monocrystalline silicon substrate 18. The n-type amorphous silicon layer 23 is formed over the i-type amorphous silicon layer 22. The i-type amorphous silicon layer 22 and the n-type amorphous silicon layer 23 form a part of the amorphous semiconductor-based layer formed over the back surface. The i-type amorphous silicon layer 22 is a layer comprising an intrinsic amorphous semiconductor film. The n-type amorphous silicon layer 23 is a layer comprising an amorphous semiconductor film including a dopant of an n-conductive type. For example, the n-type amorphous silicon layer 23 preferably has an n-type dopant concentration greater than or equal to $1 \times 10^{21}/cm^3$.

The insulating layer 24 is formed for electrically insulating the i-n layered section 21 and the i-p layered section 31. The insulating layer 24 also functions as a protection layer formed over the n-type amorphous silicon layer 23. The insulating layer may be of any material having an electrical insulating characteristic, and may preferably include, for example, aluminum nitride, silicon nitride, silicon oxide, or the like.

The n-side electrode section 25 is an electrode member provided in order to collect and extract electricity generated in the photovoltaic element 10. The n-side electrode section 25 comprises a transparent conductive layer 26, a metal layer 27, a first electrode section 28, and a second electrode section 29.

The transparent conductive layer 26 is formed over the n-type amorphous silicon layer 23. The transparent conductive layer 26 is formed from at least one of metal oxides such as indium oxide ($In_2O_3$), zinc oxide (ZnO), tin oxide ($SnO_2$), titanium oxide ($TiO_2$), and indium tin oxide (ITO). In the present embodiment, an example configuration is described in which the transparent conductive layer 26 is formed from indium tin oxide (ITO).

The metal layer 27 is formed over the transparent conductive layer 26. The metal layer 27 is a seed layer formed, for example, from a metal such as copper (Cu) or an alloy. Here, the "seed layer" refers to a layer which forms a starting point for plating growth.

The first electrode section 28 is an electrode formed over the metal layer 27 by plating. The first electrode layer 28 is formed, for example, from copper (Cu).

The second electrode section 29 is an electrode formed over the first electrode section 28 by plating. The second electrode section 29 is formed, for example, from tin (Sn).

The i-p layered section 31 is formed over the back surface of the n-type monocrystalline silicon substrate 18 in a manner to be alternately placed with the i-n layered section 21. The i-p layered section 31 comprises an i-type amorphous silicon layer 32 and a p-type amorphous silicon layer 33, and is preferably placed such that a larger amount of current can be collected in the p-side electrode section 35 to be described later from within the surface of the photovoltaic element 10. The i-p layered section 31 is preferably formed, for example, in a comb-like shape in which a plurality of finger sections extend in parallel with each other.

The i-type amorphous silicon layer 32 is a passivation layer formed over the back surface of the n-type monocrystalline silicon substrate 18. The p-type amorphous silicon layer 33 is formed over the i-type amorphous silicon layer 32. The i-type amorphous silicon layer 32 and the p-type amorphous silicon layer 33 form a part of an amorphous semiconductor-based layer formed over the back surface. The i-type amorphous silicon layer 32 is a layer comprising an intrinsic amorphous semiconductor film. The p-type amorphous silicon layer 33 is a layer comprising an amorphous semiconductor film including a dopant of a p-conductive type. For example, the p-type amorphous silicon layer 33 preferably has a p-type dopant concentration greater than or equal to $1 \times 10^{21}/cm^3$.

The p-side electrode section 35 is an electrode member provided for collecting and extracting electricity generated in the photovoltaic element 10. The p-side electrode section 35 comprises a transparent conductive layer 36, a metal layer 37, a first electrode section 38, and a second electrode section 39.

The transparent conductive layer 36 is formed over the p-type amorphous silicon layer 33. The metal layer 37, the first electrode section 38, and the second electrode section 39 are formed over the transparent conductive layer 36. The materials or the like of the transparent conductive layer 36, the metal layer 37, the first electrode section 38, and the second electrode section 39 are the same as those of the transparent conductive layer 26, the metal layer 27, the first electrode section 28, and the second electrode section 29, and will not be described in detail.

Figure 2:
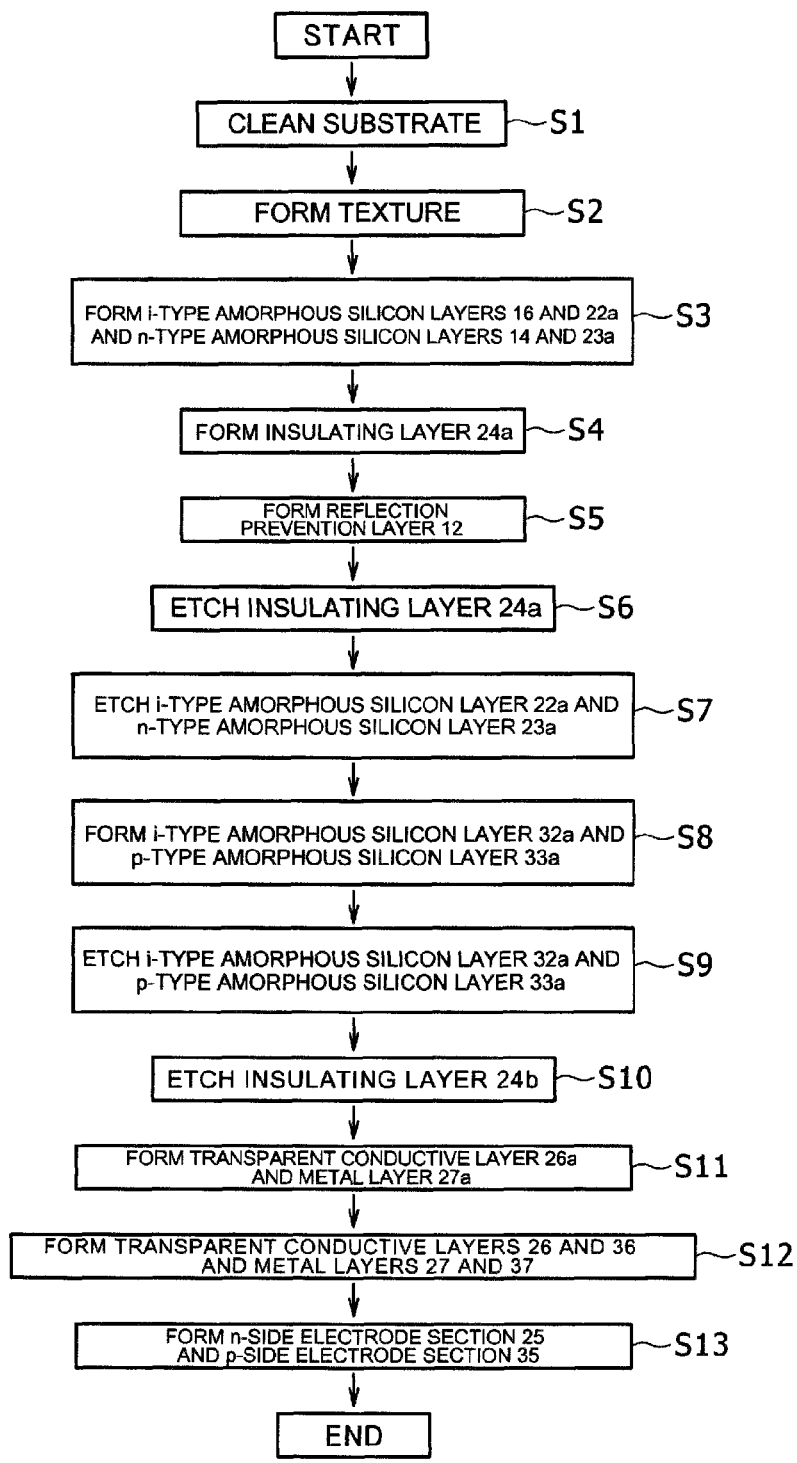
FIG. 2 is a flowchart showing steps of a method of producing the photovoltaic element according to the preferred embodiment of the present invention.

Next, an example method of producing the photovoltaic element 10 will be described. FIG. 2 is a flowchart showing steps of a method of producing the photovoltaic element 10. The method of producing the photovoltaic element 10 is not limited to the production method shown in each step. In each step, for example, sputtering, plasma CVD, screen printing, plating, or the like may be suitably employed.

First, the n-type monocrystalline silicon substrate 18 is prepared and the light-receiving surface and the back surface of the n-type monocrystalline silicon substrate 18 are cleaned (S1). Here, the cleaning of the n-type monocrystalline silicon substrate 18 can be achieved using, for example, an aqueous solution of HF or the like.

Next, a texture structure is formed on the light-receiving surface of the n-type monocrystalline silicon substrate 18 (S2). For the formation of the texture structure, for example, an anisotropic etching solution such as an aqueous solution of potassium hydroxide (aqueous solution of KOH) is employed. With this process, a projection-recess shape of a pyramid form is formed on the light-receiving surface of the n-type monocrystalline silicon substrate 18.

Figure 3:
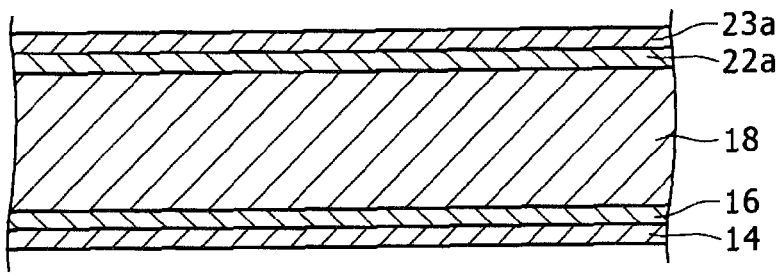
FIG. 3 is a cross sectional diagram for explaining a step of the method of producing a photovoltaic element according to the preferred embodiment of the present invention.

Then, as shown in FIG. 3, the i-type amorphous silicon layer 16 and the n-type amorphous silicon layer 14 are formed over the light-receiving surface of the n-type monocrystalline silicon substrate 18, and an i-type amorphous silicon layer 22a and an n-type amorphous silicon layer 23a are formed over the back surface of the n-type monocrystalline silicon substrate 18 (S3). In this process, each of the i-type amorphous silicon layer 16, the n-type amorphous silicon layer 14, the i-type amorphous silicon layer 22a, and the n-type amorphous silicon layer 23a may be formed, for example, through plasma CVD or the like.

Figure 4:
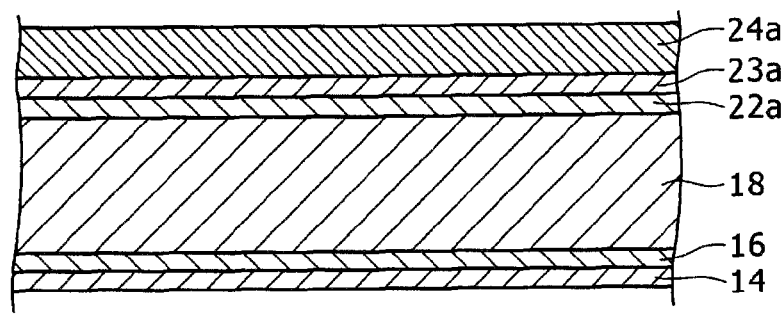
FIG. 4 is a cross sectional diagram for explaining a step of the method of producing the photovoltaic element according to the preferred embodiment of the present invention.

Then, as shown in FIG. 4, an insulting layer 24a is formed over the n-type amorphous silicon layer 23a (S4). The insulating layer 24a may be formed, for example, through a thin film formation method such as sputtering or plasma CVD.

Figure 5:
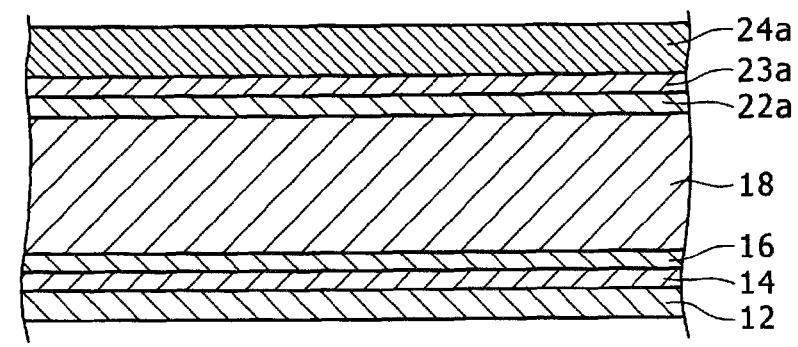
FIG. 5 is a cross sectional diagram for explaining a step of the method of producing the photovoltaic element according to the preferred embodiment of the present invention.

Next, as shown in FIG. 5, the reflection prevention layer 12 is formed over the n-type amorphous silicon layer 14 (S5). The reflection prevention layer 12 may be formed, for example, through a thin film formation method such as sputtering or plasma CVD.

Figure 6:
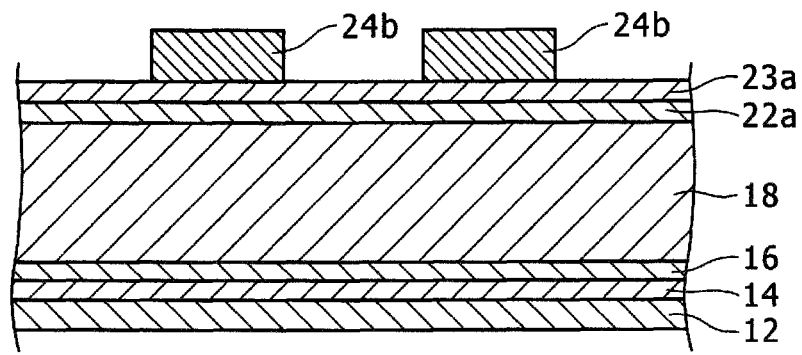
FIG. 6 is a cross sectional diagram for explaining a step of the method of producing the photovoltaic element according to the preferred embodiment of the present invention.

Next, as shown in FIG. 6, the insulating layer 24a is etched, to remove a part of the insulating layer 24a (S6). Specifically, of the insulating layer 24a, a part positioned over the region for forming the i-p layered section 31 over the n-type monocrystalline silicon substrate 18 in the later steps is removed, to form an insulating layer 24b. In this process, for the etching of the insulating layer 24a, for example, an acidic etching solution such as an aqueous solution of HF is used.

Figure 7:
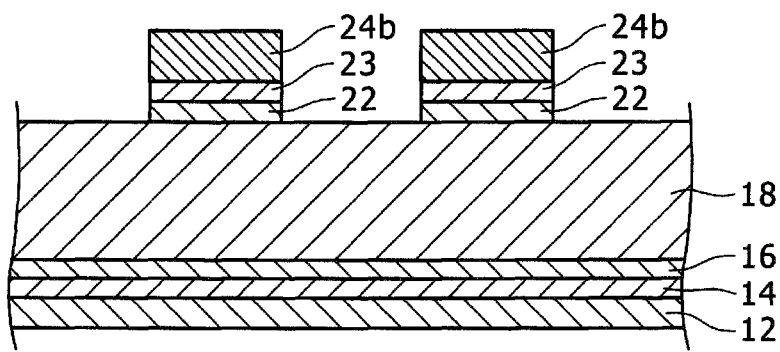
FIG. 7 is a cross sectional diagram for explaining a step of the method of producing the photovoltaic element according to the preferred embodiment of the present invention.

As shown in FIG. 7, using the insulating layer 24b patterned in S6 as a mask, the i-type amorphous silicon layer 22a and the n-type amorphous silicon layer 23a are etched (S7). Specifically, of the i-type amorphous silicon layer 22a and the n-type amorphous silicon layer 23a, parts other than the part covered by the insulating layer 24b is removed. With this process, of the back surface of the n-type monocrystalline silicon substrate 18, the part in which the insulating layer 24b is not positioned is exposed, to form the i-type amorphous silicon layer 22 and the n-type amorphous silicon layer 23. In this process, for the etching of the i-type amorphous silicon layer 22a and the n-type amorphous silicon layer 23a, for example, an alkaline etching solution such a an aqueous solution including sodium hydroxide (NaOH) is used.

Figure 8:
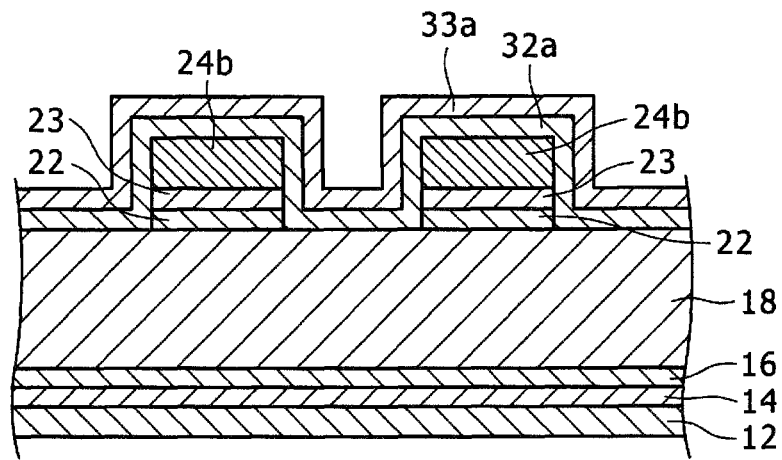
FIG. 8 is a cross sectional diagram for explaining a step of the method of producing the photovoltaic element according to the preferred embodiment of the present invention.

Then, as shown in FIG. 8, an i-type amorphous silicon layer 32a and a p-type amorphous silicon layer 33a are formed to cover the insulating layer 24b, the i-type amorphous silicon layer 22, the n-type amorphous silicon layer 23, and the exposed back surface of the n-type monocrystalline silicon substrate 18 (S8). The i-type amorphous silicon layer 32a and the p-type amorphous silicon layer 33a may be formed, for example, through plasma CVD.

Figure 9:
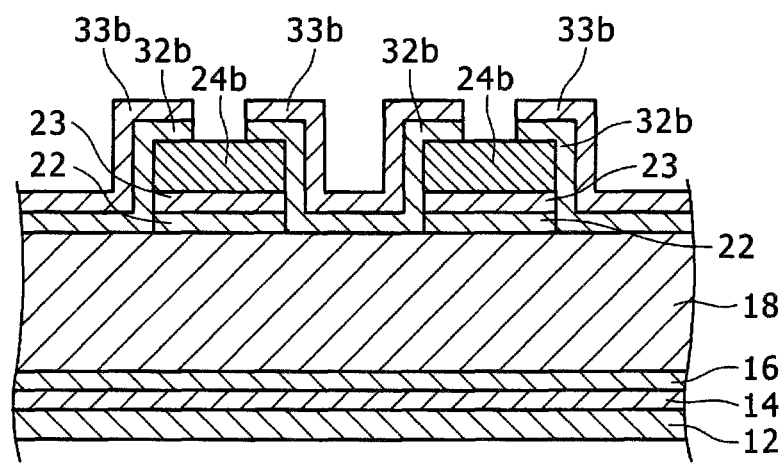
FIG. 9 is a cross sectional diagram for explaining a step of the method of producing the photovoltaic element according to the preferred embodiment of the present invention.

Next, as shown in FIG. 9, of the i-type amorphous silicon layer 32a and the p-type amorphous silicon layer 33a, a portion of a part positioned over the insulating layer 24b is etched (S9). With this process, an i-type amorphous silicon layer 32b and a p-type amorphous silicon layer 33b are formed. In this process, for the etching of the i-type amorphous silicon layer 32a and the p-type amorphous silicon layer 33a, for example, an alkaline etching solution such as an aqueous solution including sodium hydroxide (NaOH) is used.

Figure 10:
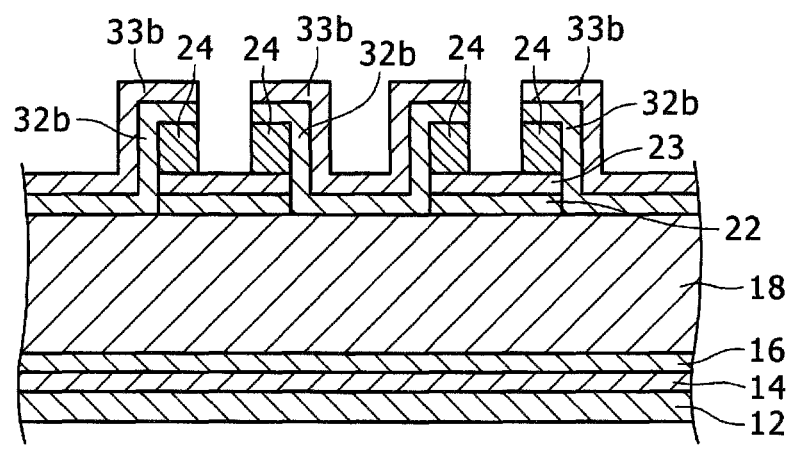
FIG. 10 is a cross sectional diagram for explaining a step of the method of producing the photovoltaic element according to the preferred embodiment of the present invention.

Then, as shown in FIG. 10, the insulating layer 24b is etched to further remove a part of the insulating layer 24b (S10). Specifically, using the i-type amorphous silicon layer 32b and the p-type amorphous silicon layer 33b as a mask, the exposed part of the insulating layer 24b is etched and removed, to form the insulating layer 24. In this process, for the etching of the insulating layer 24b, for example, an acidic etching solution such as an aqueous solution of HF is used.

Figure 11:
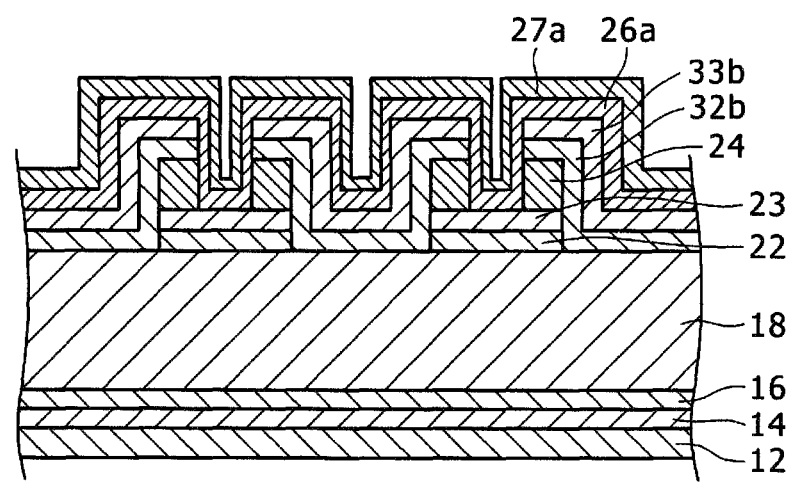
FIG. 11 is a cross sectional diagram for explaining a step of the method of producing the photovoltaic element according to the preferred embodiment of the present invention.

Then, as shown in FIG. 11, a transparent conductive layer 26a and a metal layer 27a are formed (S11). Specifically, the transparent conductive layer 26a and the metal layer 27a are formed through a thin film formation method such as plasma CVD or sputtering.

Figure 12:
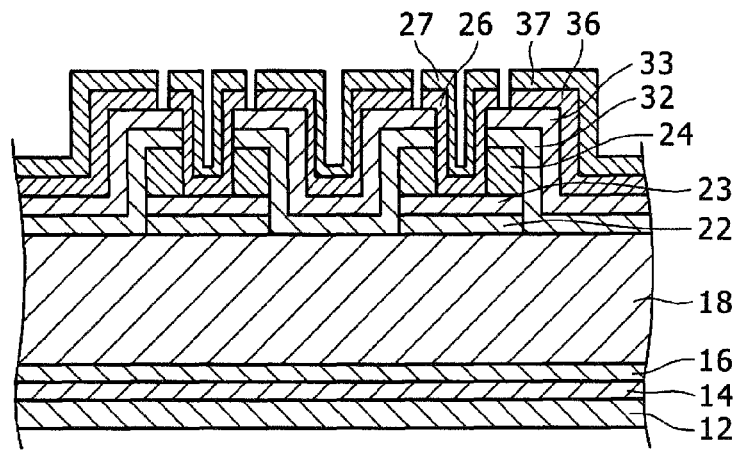
FIG. 12 is a cross sectional diagram for explaining a step of the method of producing the photovoltaic element according to the preferred embodiment of the present invention.

Next, as shown in FIG. 12, of the transparent conductive layer 26a and the metal layer 27a, a part positioned over the insulating layer 24 is partitioned, to form the transparent conductive layers 26 and 36 and the metal layers 27 and 37 (S12). In this process, the transparent conductive layer 26a and the metal layer 27a are partitioned, for example, through etching using a resist mask.

Figure 13:
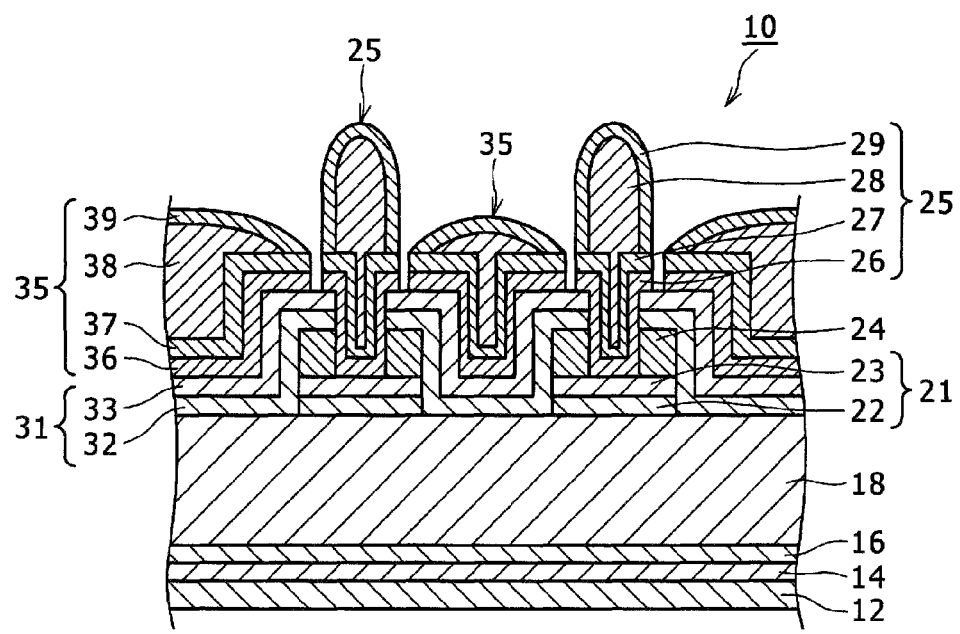
FIG. 13 is a cross sectional diagram for explaining a step of the method of producing the photovoltaic element according to the preferred embodiment of the present invention.

Then, as shown in FIG. 13, through electroplating, the first electrode section 28 and the second electrode section 29 are sequentially formed over the metal layer 27, and the first electrode section 38 and the second electrode section 39 are sequentially formed over the metal layer 37 (S13). With this process, the n-side electrode section 25 and the p-side electrode section 35 are formed.

In general, in order to inhibit recombination of carriers generated in the n-type monocrystalline silicon substrate 18 of the photovoltaic element 10, an interface between the n-type monocrystalline silicon substrate 18 and the i-type amorphous silicon layer 16 and an interface between the n-type monocrystalline silicon substrate 18 and the i-type amorphous silicon layers 22 and 32 are preferably maintained clean. Due to a difference in the degree of vacuum during film formation and wrap-around of the material gas, or the like, the degree of contamination on the surface opposite the surface on which the film is formed is greater during the film formation of the reflection prevention layer 12 and the insulating layer 24 than during the film formation of the i-type amorphous silicon films 22 and 32. Therefore, in the present embodiment, the reflection prevention layer 12 and the insulating layer 24 are formed after the i-type amorphous silicon layer 16 and the n-type amorphous silicon layer 14 are formed over the light-receiving surface of the n-type monocrystalline silicon substrate 18 and the i-type amorphous silicon layer 22 and the n-type amorphous silicon layer 23 are formed over the back surface, so that the reflection prevention layer 12 and the insulating layer 24 are formed after both surfaces of the n-type monocrystalline silicon substrate 18 are covered at least with the i-type amorphous silicon layers 16 and 22. With such a configuration, contamination of the interfaces between the n-type monocrystalline silicon substrate 18 and the i-type amorphous silicon layers 16, 22, and 32 during the film formation of the reflection prevention layer 12 and the insulating layer 24 is prevented. Therefore, the i-type amorphous silicon layers 16, 22, and 32 can preferably function as passivation layers, and the power generation characteristic of the photovoltaic element 10 can be improved.

Further, as the order of the formation of the reflection prevention layer 12 and the insulating layer 24, the insulating layer 24 positioned on the back surface side is formed before the reflection prevention layer 12 positioned on the light-receiving surface side is formed. That is, the insulating layer 24 is formed to cover the n-type amorphous silicon layer 23, and to consequently prevent wrap-around of the material gas to a region over the n-type amorphous silicon layer 23 when the reflection prevention layer 12 is later formed. With this configuration, the surface of the n-type amorphous silicon layer 23 which is in contact with the n-side electrode section 25 which directly contributes to the collection of carriers can be maintained clean, and the contact resistance with the n-side electrode section 25 can be reduced. Therefore, the electricity collection efficiency in the n-side electrode section 25 can be improved and the power generation characteristic of the photovoltaic element 10 can be improved.

Moreover, in general, the insulating layer 24a has a higher mechanical strength compared to the n-type amorphous silicon layer 23a. By covering the region over the n-type amorphous silicon layer 23a with the insulating layer 24a, it is possible to inhibit damaging of the surface of the n-type amorphous silicon layer 23a during the production steps of the photovoltaic element 10, to improve electrical contact with the n-side electrode section 25, and to reduce the contact resistance. Therefore, the electricity collection efficiency at the n-side electrode section 25 can be improved and the power generation characteristic of the photovoltaic element 10 can be improved.

EXPLANATION OF REFERENCE NUMERALS

10 PHOTOVOLTAIC ELEMENT; 12 REFLECTION PREVENTION LAYER; 24, 24a, 24b INSULATING LAYER; 14, 23, 23a n-TYPE AMORPHOUS SILICON LAYER; 16, 22, 22a, 32, 32a, 32b i-TYPE AMORPHOUS SILICON LAYER; 18 n-TYPE MONOCRYSTALLINE SILICON SUBSTRATE; 21 i-n LAYERED SECTION; 25 n-SIDE ELECTRODE SECTION; 26, 26a, 36 TRANSPARENT CONDUCTIVE LAYER; 27, 27a, 37 METAL LAYER; 28, 38 FIRST ELECTRODE SECTION; 29, 39 SECOND ELECTRODE SECTION; 31 i-p LAYERED SECTION; 33, 33a, 33b p-TYPE AMORPHOUS SILICON LAYER; 35 p-SIDE ELECTRODE SECTION

The invention claimed is:

1. A method of producing a photovoltaic element, comprising:
   a first step in which a first amorphous semiconductor-based layer is formed over a light-receiving surface of a crystalline semiconductor-based substrate;
   a second step in which a second amorphous semiconductor-based layer is formed over a back surface of the crystalline semiconductor-based substrate; and
   a third step in which, after the first step and the second step are completed, a first protection layer is formed over the first amorphous semiconductor-based layer after a second protection layer is formed over the second amorphous semiconductor-based layer,
   wherein the first protection layer is directly in contact with the first amorphous semiconductor-based layer;
   wherein the second amorphous semiconductor-based layer includes an n-type semiconductor layer provided in a first region and a p-type semiconductor layer provided in a second region different from the first region, and
   the photovoltaic element includes a first electrode provided on the n-type semiconductor layer and a second electrode provided on the p-type semiconductor layer.

2. The method of producing the photovoltaic element according to claim 1, wherein
   the crystalline semiconductor-based substrate is of an n-type,
   the first amorphous semiconductor-based layer comprises:
   a first i-type amorphous semiconductor-based layer formed over the light-receiving surface of the crystalline semiconductor-based substrate; and
   a first n-type amorphous semiconductor-based layer formed over the first i-type amorphous semiconductor-based layer, and
   the second amorphous semiconductor-based layer comprises:
   a second i-type amorphous semiconductor-based layer formed over the back surface of the crystalline semiconductor-based substrate; and
   a second n-type amorphous semiconductor-based layer formed over the second i-type amorphous semiconductor-based layer.

3. The method of producing the photovoltaic element according to claim 1, wherein
   either one or both of the first protection layer and the second protection layer comprises at least one of the group of aluminum oxide, aluminum nitride, silicon nitride, and silicon oxide.

4. The method of producing the photovoltaic element according to claim 2, wherein
   either one or both of the first protection layer and the second protection layer comprises at least one of the group of aluminum oxide, aluminum nitride, silicon nitride, and silicon oxide.

* * * * *